United States Patent [19]

Miller et al.

[11] Patent Number: 6,083,662
[45] Date of Patent: Jul. 4, 2000

[54] METHODS OF IMAGING AND PRINTING WITH A POSITIVE-WORKING INFRARED RADIATION SENSITIVE PRINTING PLATE

[76] Inventors: Gary R. Miller; Melanie A. Felker; Paul R. West; Jeffery A. Gurney; Neil F. Haley, all of Eastman Kodak Company 9952 Eastman Park Dr., Bldg. 60, Windsor, Colo. 80551-1610

[21] Appl. No.: 08/866,736

[22] Filed: May 30, 1997

[51] Int. Cl.⁷ ........................................... G03F 7/30
[52] U.S. Cl. ........................ 430/302; 430/331; 430/309
[58] Field of Search .................................. 430/302, 944, 430/331

[56] References Cited

U.S. PATENT DOCUMENTS

| | | | |
|---|---|---|---|
| 3,615,480 | 10/1971 | Lam | 96/48 |
| 3,650,745 | 3/1972 | Hackmann et al. | 96/35.1 |
| 4,259,434 | 3/1981 | Yamasue et al. | 430/302 |
| 4,452,880 | 6/1984 | Seino et al. | 430/309 |
| 4,469,776 | 9/1984 | Matsumoto et al. | 430/309 |
| 4,576,903 | 3/1986 | Baron et al. | 430/331 |
| 4,592,992 | 6/1986 | Hsieh et al. | 430/309 |
| 4,613,561 | 9/1986 | Lewis | 430/326 |
| 4,628,023 | 12/1986 | Cawston et al. | 430/331 |
| 4,661,436 | 4/1987 | Lewis et al. | 430/326 |
| 4,708,925 | 11/1987 | Newman | 430/270 |
| 4,822,723 | 4/1989 | Dhillon | 430/331 |
| 4,945,030 | 7/1990 | Turner et al. | 430/331 |
| 4,966,798 | 10/1990 | Brosius et al. | 428/64 |
| 5,002,853 | 3/1991 | Aoai et al. | 430/281 |
| 5,035,982 | 7/1991 | Walls | 430/331 |
| 5,164,286 | 11/1992 | Blakeney et al. | 430/331 |
| 5,234,796 | 8/1993 | Shimura et al. | 430/331 |
| 5,250,393 | 10/1993 | Imai et al. | 430/302 |
| 5,279,927 | 1/1994 | Walls et al. | 430/331 |
| 5,292,626 | 3/1994 | Buhr et al. | 430/331 |
| 5,316,892 | 5/1994 | Walls et al. | 430/309 |
| 5,340,699 | 8/1994 | Haley et al. | 430/302 |
| 5,372,907 | 12/1994 | Haley et al. | 430/157 |
| 5,372,917 | 12/1994 | Tsuchida et al. | 430/343 |
| 5,380,623 | 1/1995 | Miller et al. | 430/331 |
| 5,466,557 | 11/1995 | Haley et al. | 430/278 |
| 5,466,559 | 11/1995 | Miller et al. | 430/331 |
| 5,480,762 | 1/1996 | Toyama et al. | 430/302 |
| 5,695,903 | 12/1997 | Elsaesser et al. | 430/117 |
| 5,766,826 | 6/1998 | Miller et al. | 430/331 |
| 5,811,211 | 9/1998 | Miller et al. | 430/302 |

FOREIGN PATENT DOCUMENTS

| | | |
|---|---|---|
| 0 323 836 | 1/1988 | European Pat. Off. . |
| 347245 | 12/1989 | European Pat. Off. . |
| 0 672 954 A2 | 9/1995 | European Pat. Off. . |
| 823 327 | 2/1998 | European Pat. Off. . |
| 195 20 741 A1 | 6/1994 | Germany . |
| 61215554 | 3/1985 | Japan . |
| 62-04241 | 7/1987 | Japan . |
| 1056442 | 3/1989 | Japan . |
| 287561 | 11/1989 | Japan . |
| 2010355 | 3/1990 | Japan . |
| 3228054 | 10/1991 | Japan . |
| 2060923 | 9/1979 | United Kingdom . |
| 227629 | 10/1994 | United Kingdom . |
| 2276729 | 10/1994 | United Kingdom . |
| 97/39894 | 4/1996 | WIPO . |

*Primary Examiner*—Kathleen Duda
*Assistant Examiner*—Jill N. Hackathorn
*Attorney, Agent, or Firm*—Ratner & Prestia

[57] ABSTRACT

A positive-working lithographic printing plate is used to provide a positive image without a post-exposure baking step and without any floodwise exposure steps. The printing plate includes a layer that is imageable using an infrared radiation laser. This layer consists essentially of a phenolic resin, an infrared radiation absorbing compound, and a dissolution inhibitor that is non-photosensitive and is capable of providing sites for hydrogen bonding with the phenolic moieties of the binder resin. These printing plates are developed with an alkaline composition that includes an alkali metal silicate, a thickener and a fluorosurfactant or phosphate ester hydrotrope.

35 Claims, No Drawings

METHODS OF IMAGING AND PRINTING WITH A POSITIVE-WORKING INFRARED RADIATION SENSITIVE PRINTING PLATE

FIELD OF THE INVENTION

This invention relates to a method of processing a positive-working printing plate that is sensitive to infrared radiation. It also relates to a method of printing with such printing plates.

BACKGROUND OF THE INVENTION

The art of lithographic printing is based upon the immiscibility of oil and water, wherein the oily material or ink is preferentially retained by the image areas and the water or fountain solution is preferentially retained by the nonimage areas. When a suitably prepared surface is moistened with water and an ink is then applied, the background or nonimage areas retain the water and repel the ink while the image areas accept the ink and repel the water. The ink on the image areas is then transferred to the surface of a material upon which the image is to be reproduced, such as paper, cloth and other materials. Commonly, the ink is transferred to an intermediate material called the blanket which in turn transfers the ink to the surface of the material upon which the image is to be reproduced.

A widely used type of lithographic printing plate has a light-sensitive coating applied to an aluminum base support. The coating may respond to light by having the portion that is exposed become hardened so that nonimage areas are removed in the developing process. Such a plate is referred to in the art as a negative-working printing plate. Conversely, when those portions of the coating that are exposed become soluble so that they are removed during development, the plate is referred to as a positive-working plate. In both instances, the coating remaining on the plate is ink-receptive or oleophilic and the nonimage areas or background are water-receptive or hydrophilic. The differentiation between image and nonimage areas is made in the exposure process where a film is applied to the plate with a vacuum to insure good contact. The plate is then exposed to a light source, a portion of which is composed of UV radiation. In the instance of positive-working plates, the areas on the film corresponding to the image areas are darkened, preventing light from making those plate coating areas developer soluble, while the areas on the film corresponding to the plate nonimage areas are clear, allowing them to become soluble. The solubilized plate image areas can be removed during development. The unexposed areas of a positive-working plate remain after development, are oleophilic and will accept ink while the exposed areas that have had the coating removed through the action of a developer are desensitized and are therefore hydrophilic.

Various useful printing plates that can be either negative-working or positive-working are described, for example, in GB 2,082,339 (Horsell Graphic Industries), and U.S. Pat. No. 4,927,741 (Garth et al), both of which describe imaging layers containing an o-diazoquinone and a resole resin, and optionally a novolac resin. Another plate that can be similarly used is described in U.S. Pat. No. 4,708,925 (Newman) wherein the imaging layer comprises a phenolic resin and a radiation-sensitive onium salt. This imaging composition can also be used for the preparation of a direct laser addressable printing plate, that is imaging without the use of a photographic transparency.

Printing plates comprising imaging layers that contain novolac resins, infrared radiation absorbing compounds and other materials are described, for example, in U.S. Pat. No. 5,340,699 (Haley et al), U.S. Pat. No. 5,372,907 (Haley et al), U.S. Pat. No. 5,372,917 (Haley et al), U.S. Pat. No. 5,466,557 (Haley et al) and EP-A-0 672 954 (Eastman Kodak). Imaging with these plates includes exposure to near-infrared energy to produce acids in an imagewise fashion. These acids catalyze crosslinking of the coating in a post-exposure heating step. Precise temperature control is required in the heating step.

DE-4,426,820 (Fuji) describes a printing plate that can be imaged in the near infrared at moderate power levels with relatively simple processing requirements. This printing plate has at least two layers: an imaging layer containing an o-diazoquinone compound and an infrared radiation absorbing compound, and a protective overcoat containing a water-soluble polymer or silicone polymer. This plate is floodwise exposed with ultraviolet light to convert the o-diazoquinone to an indenecarboxylic acid, which is then imagewise decarboxylated by means of heat transferred from the infrared radiation absorbing material. Development with an alkaline solution results in removal of areas not subjected to thermal decarboxylation. The pre-imaging floodwise exposure step, however, is awkward in that it precludes the direct loading of the printing plates into plate-setters.

Optical recording media having laser imageable layers are described in U.S. Pat. No. 4,966,798 (Brosius et al). Such layers contain an infrared radiation absorbing dye or pigment in a phenolic resin, and are resident on a suitable polymeric support. Recordation is carried out using a laser to bring about a surface change in the imageable layer. Printing plates are different materials and require a different imaging process.

In copending and commonly assigned U.S. Ser. No. 08/822,376 filed Mar. 21, 1997, (pending) by Sheriff et al, positive-working printing plates are described that can be processed directly after imaging without any intervening baking or floodwise exposure steps. Such plates have a very simple imaging layer consisting essentially of a novolac resin and an infrared radiation (IR) absorbing compound in specific molar ratios.

Various aqueous solutions are known for use as developers for both positive-working and negative-working printing plates. It is known to use a dispersion of a silicate to develop positive-working printing plates, as described, for example, in U.S. Pat. No. 4,259,434 (Yamasue et al). These solutions include alkali metal silicates, in which the ratio of $SiO_2$ to M is from 0.5 to 0.75 ("M" being the alkali metal) and the $SiO_2$ concentration is about 1–4%. However, many of such developers are overly active and attack or remove the unexposed image on the plates. The replenishment rate of such developers is critical because the operational range of the developers is very narrow.

U.S. Pat. No. 4,452,880 (Seino et al) describes silicate-containing developers wherein the $SiO_2$ to alkali metal oxide ratios are much higher, that is between 1.6 and 2.0, and the % $SiO_2$ concentration is from about 2 to about 9%. These developers have relatively low activity, resulting in slow or incomplete development within the time necessary for practical commercial use. Thus, higher amounts of silicate must be included. Such higher amounts can be disadvantageous due to cost, residue on the plates and the potential for clogging processing equipment.

Miller, U.S. Pat. No. 5,766,826, and U.S. Ser. No. 08/729,472, pending filed by Miller, Stuber and Felker on Oct. 11, 1996, describe alkaline developing compositions that overcome the problems noted above and provide a significant advance in the art. Both applications describe compositions containing specific amounts of silicates, and preferred compositions also include at least 6% (by weight) of a water-soluble or water-dispersible thickener, such as glycerine.

Copending and commonly assigned U.S. Ser. No. 08/821,844 pending filed Mar. 21, 1997, by West et al describes positive-working infrared radiation sensitive printing plates containing a non-photosensitive dissolution inhibitor in admixture with a phenolic resin and an infrared radiation absorbing compound. Such printing plates provide a significant advance in the art, but there is a need to further improve their optimal performance and to provide greater processing latitude so that the development conditions need not be so carefully controlled in order to provide desired discrimination between image and nonimage areas.

SUMMARY OF THE INVENTION

The present invention provides a method of processing a positive-working printing plate comprising a support having thereon an imaging composition consisting essentially of a phenolic binder resin, an infrared radiation absorbing compound, and a non-photosensitive dissolution inhibitor compound capable of providing sites for hydrogen bonding with the phenolic moieties of the binder resin, the method comprising developing the printing plate with an alkaline developing composition having a pH of at least 12 and comprising:
a) an alkali metal silicate,
b) at least 6 weight % of a water-soluble or water-dispersible thickener, and
c) at least 0.0005 weight % of a nonionic fluorosurfactant, a phosphate ester hydrotrope, or a mixture thereof.

Still further, a method for providing a positive image consists essentially of the steps of:

A) imagewise exposing the positive-working lithographic printing plate described above with an infrared radiation emitting laser, and B) contacting the element with the alkaline developing composition described above to remove the exposed areas of the positive-working printing plate.

Still further, this invention provides a method for printing comprising:

A) imagewise exposing the positive-working lithographic printing plate described above with an infrared radiation emitting laser, B) contacting the element with the alkaline developing composition described above to remove the exposed areas of the positive-working printing plate, and C) contacting the developed printing plate with an aqueous fountain solution and a lithographic printing ink, thereby forming an inked lithographic printing surface, and D) contacting the inked lithographic printing surface with a substrate to thereby transfer the printing ink to the substrate, forming an image thereon.

The printing plates described herein are useful for providing high quality positive images using moderately powered lasers. Since the printing plates are infrared radiation sensitive, digital imaging information can be conveniently utilized to form continuous or halftone positive images. The printing plate is simple in construction, having only a single imaging layer that has only three essential components: a phenolic binder resin, an IR absorbing compound, and a compound that is identified herein as a "dissolution inhibitor". Such a compound inhibits the dissolution of the phenolic binder resin by providing hydrogen acceptor sites for hydrogen bonding with the phenolic moieties of the binder resin. In its most preferred form, the imaging layer may also contain a development accelerator. This allows one to formulate the imaging composition to optimize the amount of IR absorbing compound independent of its effect on the rate of resin dissolution.

After laser imaging, development is the only other step needed to provide a positive image. No pre-imaging or post-imaging flood exposure, or post-imaging baking, step is necessary in the practice of this invention. There is greater flexibility in the selection of development times and temperatures. Moreover, the compounds used as dissolution inhibitors are non-photosensitive so the plates can be readily handled in room light.

The particular alkaline developing composition useful in the invention enables greater processing latitude and optimal performance with or without the presence of development accelerators in the printing plate. These advantages are possible by the inclusion in the developer composition of a nonionic fluorosurfactant, phosphate ester hydrotrope or a mixture thereof. Moreover, specially designed replenishing solutions are unnecessary since the developing composition has desired activity for extended usefulness. Thus, the user can obtain more consistent photographic speed and image quality throughout the time the composition is useful.

DETAILED DESCRIPTION OF THE INVENTION

The phenolic binder resins useful in the printing plates described herein include any alkali soluble resin having a reactive hydroxy group. The phenolic binder resins are light-stable, water-insoluble, alkali-soluble film-forming resins that have a multiplicity of hydroxy groups either on the backbone of the resin or on pendant groups. The resins typically have a molecular weight of at least 350, and preferably of at least 1000, as determined by gel permeation chromatography. An upper limit of the molecular weight would be readily apparent to one skilled in the art, but practically it is about 100,000. The resins also generally have a pKa of not more than 11 and as low as 7.

As used herein, the term "phenolic resin" also includes, but is not limited to, what are known as novolac resins, resole resins and polyvinyl compounds having phenolic hydroxy groups. Novolac resins are preferred.

Novolac resins are generally polymers that are produced by the condensation reaction of phenols and an aldehyde, such as formaldehyde, or aldehyde-releasing compound capable of undergoing phenol-aldehyde condensation, in the presence of an acid catalyst. Typical novolac resins include, but are not limited to, phenol-formaldehyde resin, cresol-formaldehyde resin, phenol-cresol-formaldehyde resin, p-t-butylphenol-formaldehyde resin, and pyrogallol-acetone resins. Such compounds are well known and described for example in U.S. Pat. No. 4,308,368 (Kubo et al), U.S. Pat. No. 4,845,008 (Nishioka et al), U.S. Pat. No. 5,437,952 (Hirai et al) and U.S. Pat. No. 5,491,046 (DeBoer et al), U.S. Pat. No. 5,143,816 (Mizutani et al) and GB 1,546,633 (Eastman Kodak). A particularly useful novolac resin is prepared by reacting m-cresol or phenol with formaldehyde using conventional conditions.

Phenolic resins that are known as "resole resins", including, for example, condensation products of bis-phenol A and formaldehyde, are also useful in this invention.

Still another useful phenolic binder resin is a polyvinyl compound having phenolic hydroxyl groups. Such compounds include, but are not limited to, polyhydroxystyrenes and copolymers containing recurring units of a hydroxystyrene, and polymers and copolymers containing recurring units of halogenated hydroxystyrenes. Such polymers are described for example in U.S. Pat. No. 4,845,008 (noted above).

Other useful novolacs are described in U.S. Pat. No. 4,306,010 (Uehara et al) and U.S. Pat. No. 4,306,011 (Uehara et al). Still other useful phenolic resins are described in U.S. Pat. No. 5,368,977 (Yoda et al).

A mixture of the resins described above can be used, but preferably, a single novolac resin is present as the binder resin in the imaging composition.

In the dried imaging layer of the printing plate, the binder resin is the predominant material. Generally, it comprises at least 50 weight %, and more preferably from about 60 to about 88 weight %, of the dried layer.

A second essential component of the imaging composition is an IR absorbing compound, or a mixture thereof. Such compounds typically have a maximum absorption wavelength ($\lambda_{max}$) of at least 700 nm, that is in the infrared and near infrared regions of the spectrum, and more particularly, at from about 800 to about 1100 nm. Particularly useful IR dyes are those having high extinction coefficients at wavelengths corresponding to the output of commercially available diode lasers (such as at 784 nm, 830 nm, 873 nm and 981 nm), Nd:YLF lasers (1053 nm) and ND:YAG lasers (1064 nm). Carbon black and other pigments, or dyes having broad spectral absorption characteristics are also useful as IR absorbing compounds. Mixtures of dyes, pigments, or dyes and pigments can also be used so that a given composition can be imaged at multiple wave lengths.

Classes of materials that are useful include, but are not limited to, squarylium, croconate, cyanine (including phthalocyanine), merocyanine, chalcogenopyryloarylidene, oxyindolizine, quinoid, indolizine, pyrylium and metal dithiolene dyes or pigments. Other useful classes include thiazine, azulenium and xanthene dyes. Particularly useful IR absorbing dyes are of the cyanine class. Other useful cyanine IR absorbing dyes are described in U.S. Pat. No. 4,973,572 (DeBoer) and U.S. Pat. No. 5,166,024 (Bugner et al), both incorporated herein by reference.

The amount of IR absorbing compound in the dried imaging layer is generally sufficient to provide an optical density of at least 0.05 in the layer, and preferably, an optical density of from about 0.5 to about 2. This range would accommodate a wide variety of compounds having vastly different extinction coefficients. Generally, this is at least 0.1 weight %, and preferably from about 1 to about 20 weight % of the dry coating weight.

The weight ratio of the IR absorbing compound to phenolic binder resin is at least 1:1000, and preferably from about 1:200 to about 1:10. The optimum ratio will depend upon the phenolic binder resin and IR absorbing compound being used, and can be determined with routine experimentation.

One or more "dissolution inhibitor compounds" are present in the imaging composition as the third essential component. Such compounds have polar functionality that serve as acceptor sites for hydrogen bonding with hydroxy groups on aromatic rings. The acceptor sites are atoms with high electron density, preferably selected from electronegative second row elements. Useful polar groups include keto groups (including vinylogous esters). Other groups may also be useful, such as sulfones, sulfoxides, thiones, phosphine oxides, nitrites, imides, amides, thiols, ethers, alcohols, ureas as well as nitroso, azo, azoxy, nitro and halo groups. In general, it is desired that such compounds have an "inhibition factor" of at least 0.5, and preferably at least 5 and more preferably, at least 15. The higher this value is, the more useful is the compound.

Inhibition factors for given compounds can be readily measured using the procedure described by Shih et al, *Macromolecules*, Vol. 27, p. 3330 (1994). The inhibition factor is the slope of the line obtained by plotting the log of the development rate as a function of inhibitor concentration in the phenolic resin coating. Development rates are conveniently measured by laser interferometry, as described by Meyerhofer in IEEE *Trans. Electron Devices*, ED-27, 921 (1980).

Representative compounds having the desired properties reported dissolution (inhibition factors listed in parentheses) include aromatic ketones including, but not limited to, xanthones (2.26), flavanones (6.80), flavones (18.3), 2,3-diphenyl-1-indenones (23.6), pyrones (including thiopyrones), and 1'-(2'-acetonaphthonyl)benzoate, and include such compounds as α- and β-naphthoflavone (49.1 and 46.6, respectively), 2,6-diphenyl-4H-pyran-4-one, 2,6-diphenylpyrone, 2,6-diphenylthiopyrone, 2,6-di-t-butylthiopyrone and 2,6-diphenyl-4H-thiopyran-4-one. The flavones and pyrones are preferred, including but not limited to, α-naphthoflavone, 2,6-diphenyl-4H-pyran-4-one and 2,6-diphenyl-4H-thiopyran-4-one.

The dissolution inhibitors are not themselves actually sensitive to near-IR radiation. Their dissolution inhibition abilities are presumably altered by the localized heating that results from irradiation of the IR absorbing compound. Thus, by "non-photosensitive" is meant that these compounds are not significantly sensitive to actinic radiation having a wavelength above about 400 nm, and preferably above 300 nm. Thus, the conventional photosensitive o-naphthoquinonediazides are not useful in this respect.

The weight ratio of the dissolution inhibitor compound to phenolic binder resin is at least 1:100, and most preferably from about 5:100 to about 25:100. The optimum weight ratio will depend upon the inhibition factor of the dissolution inhibitor compound, the phenolic resin binder, the amount and type of IR radiation absorbing compound, the amount and type of other addenda, and the developer composition used, and can be readily determined by routine experimentation by a skilled artisan. In the dry coating, the amount of dissolution inhibitor compound is generally at least 1% (based on total dry weight).

While not essential, a desirable component of the imaging layer is a developing accelerator (or mixture thereof). Such compounds are well known and described for example, in U.S. Pat. No. 5,130,225 (Uctani), U.S. Pat. No. 5,215,856 (Jayaraman), U.S. Pat. No. 5,554,797 (Schulz et al), and U.S. Pat. No. 5,145,763 (Bassett et al) incorporated herein by reference, and EP-A-0 745 575 (Fuji). Generally, such compounds are low molecular weight polyphenolic compounds or cyclic anhydrides. Most preferred is 4,6-dimethyl-N,N'-diphenyl-1,3-benzenesulfonamide.

When present, the one or more development accelerators are found in the imaging layer at a weight ratio to the phenolic resin of at least 0.5:100, and most preferably from about 1:100 to about 12.5:100.

Optional, non-essential components of the imaging composition include colorants, cross-linking agents, sensitizers, stabilizers, exposure indicators and surfactants in conventional amounts.

The imaging composition is coated out of one or more suitable organic solvents in which all components are soluble or dispersible. Various solvents for this purpose are well known, but acetone and 1-methoxy-2-propanol are preferred. Mixtures can be used if desired. The essential components of the composition are dissolved in the solvents in suitable proportions to provide the desired dry amounts.

Suitable conditions for drying the imaging composition involve heating for a period of time of from about 0.5 to about 5 minutes at a temperature in the range of from about 20 to about 300° C.

To form a printing plate useful in this invention, the imaging composition is applied (usually by coating techniques) onto a suitable support, such as a metal sheet, polymeric film (such as a polyester), ceramics or polymeric-coated paper using conventional procedures and equipment. Suitable metals include aluminum, zinc or steel, but preferably, the metal is aluminum. A most preferred support is an electrochemically grained and sulfuric acid anodized aluminum sheet, that can be further treated with an acrylamide-vinylphosphonic acid copolymer according to the teaching in U.S. Pat. No. 5,368,974 (Walls et al).

The thickness of the resulting positive-working imaging layer, after drying, on the support can vary widely, but typically it is in the range of from about 0.5 to about 2 $\mu$m, and preferably from about 1 to about 1.5 $\mu$m.

No other essential layers are provided on the printing plate, however protective or other type of layers may be coated over the imaging layer. Optional, but not preferred subbing or antihalation layers can be disposed under the imaging layer, or on the backside of the support (such as when the support is a transparent polymeric film).

The printing plates are uniquely adapted for "direct-to-plate" imaging applications. Such systems utilize digitized image information, as stored on a computer disk, compact disk, computer tape or other digital information storage media, or information that can be provided directly from a scanner, that is intended to be printed. The bits of information in a digitized record correspond to the image elements or pixels of the image to be printed. This pixel record is used to control the exposure device, that is a modulated laser beam. The position of the laser beam can be controlled using any suitable means known in the art, and turned on and off in correspondence with pixels to be printed. The exposing beam is focused onto the unexposed printing plate. Thus, no exposed and processed films are needed for imaging of the plate, as in the conventional lithographic imaging processes.

Laser imaging can be carried out using any moderate or high-intensity laser writing device. Specifically, a laser printing apparatus is provided that includes a mechanism for scanning the write beam across the element to generate an image without ablation. The intensity of the write beam generated at the laser diode source at the printing plate is at least 0.2 mW/$\mu$m$^2$. During operation, the plate to be exposed is placed in the retaining mechanism of the writing device and the write beam is scanned across the plate to generate an image.

Following laser imaging, the printing plate of this invention is then developed in an alkaline developing composition until the exposed areas are removed to provide the desired positive image.

The aqueous alkaline developing compositions useful in this invention include at least one alkali metal silicate, such as a lithium, sodium and potassium silicate. Sodium and potassium silicates are preferred and potassium silicate is most preferred. A mixture of alkali metal silicates can be used if desired.

Especially preferred developing compositions contain an alkali metal silicate having a $Si_2O$ to $M_2O$ weight ratio of at least 0.3 wherein "M" is the alkali metal (such as potassium). Preferably, this ratio is from about 0.3 to about 1.2. More preferably, it is from about 0.6 to about 1.1, and most preferably, it is from about 0.7 to 1.0.

The amount of alkali metal silicate in the developing composition is generally at least 20 grams $SiO_2$ per 1000 grams of composition (that is, 2 weight %), and preferably from about 20 to about 80 grams $SiO_2$/1000 grams of composition. Most preferably, it is from about 40 to about 65 g $SiO_2$/1000 g of developing composition. Various commercial sources of silicates are known.

The developing composition has an alkaline pH that is generally at least 12, and preferably from about 12 to about 14. In addition to the alkali silicate, alkalinity can be provided using a suitable concentration of any suitable chemical base, such as a hydroxide (for example, ammonium hydroxide, sodium hydroxide, lithium hydroxide and potassium hydroxide).

Useful thickeners for the developing compositions are water-soluble or water-dispersible polyhydroxy compounds. Representative compounds include, but are not limited to, glycerine (or glycerol), polyethylene glycol, polypropylene glycol and other similar materials having a plurality of hydroxy groups, that would be readily apparent to one skilled in the art in view of the teaching herein. The particular thickener that will provide the desired performance may depend upon its concentration, and the amount of chemical base or silicates used. Thus, some routine experimentation may be needed to find the optimum levels of a given thickener. Thickeners that provide these unexpected universal processing properties include non-polymeric thickeners such as glycerine. A mixture of thickeners can be used if desired.

The amount of thickener used in the developing composition is at least 6 weight %, and an amount of from about 6 to about 30 weight % is preferred. More preferably, the thickener is present in an amount of from about 7.5 to about 18 weight %. The amount of thickener used in a given developing composition may vary. A most preferred composition includes glycerine at a concentration of from about 8 to about 12 weight %.

Useful nonionic fluorosurfactants are surfactant active agents that are typically water-soluble and have one or more fluorocarbon moieties in the molecule wherein at least one hydrogen atom has been replaced with a fluorine atom. Each fluorocarbon moiety generally has at least 4 carbon atoms and can be saturated or unsaturated.

A representative class of nonionic fluorosurfactants has the formula:

$$R_f-CH_2CH_2O-(CH_2CH_2O)_{\overline{z}}H$$

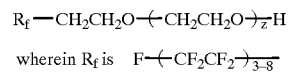

and z is 4 to 20. Representative useful fluorosurfactants of this type include, but are not limited to, fluoroalkylpolyethyleneoxide alcohols, such as those commercially available as ZONYL® FSN, ZONYL® FS 300 or ZONYL® FSO nonionic surfactants from DuPont, and FLURAD™ FC-430 or FLUOWET™ OT from Hoechst. ZONYL™ FSN nonionic surfactant is most preferred.

Phosphate ester hydrotropes are anionic phosphate ester surfactants containing at least one phosphate ester moiety. As "hydrotropes", such compounds help solubilize other surfactants, and may themselves have surfactant properties. A preferred phosphate ester hydrotrope is an alkyl aryl alkoxy phosphate, potassium salt that is commercially available as TRITON® H-66 from Union Carbide. Other useful commercial products include TRITON® H-55, an aryl alkoxy phosphate ester, potassium salt. Thus, a useful class of hydrotropes are aryl alkoxy phosphate esters, wherein the aryl and alkoxy portions of the molecule can be repeated numerous times and can be substituted or unsubstituted.

The amount of nonionic fluorosurfactant or phosphate ester hydrotrope useful in the developing composition is at least 0.005 grams per 1000 grams of solution, and up to 4 grams per 1000 grams of solution (that is, from about 0.0005 to about 0.4 weight %). Preferably, either or both types of compounds are present in an amount of from about 0.5 to about 3 grams per 1000 grams of solution (that is, from about 0.05 to about 0.3 weight %).

Mixtures of nonionic fluorosurfactants, phosphate ester hydrotropes, or both types of compounds, can be used if desired as long as the total amounts are as described above.

Optional components of the developing composition include one or more nonfluorinated surfactants (anionic, nonionic and amphoteric) other than those noted above, in a suitable amount (for example, up to 3% based on total composition weight), a biocide (antimicrobial or antifungal agent), one or more anti-foaming agents, or chelating agents, such as alkali gluconates. However, in preferred embodiments, non-fluorinated surfactants, anti-foaming agents and chelating agents are omitted from the composition.

After development, the element can be treated with a finisher such as gum arabic, if desired. However, no other essential steps besides development in needed. Thus, no post-imaging bake step is carried out, nor is floodwise exposure needed before or after imaging.

Following imaging and development, the printing plates described herein can be used to print, or transfer the image, to suitable substrates (such as paper, fabrics, ceramics, metals and plastics), after suitable inking of the printing surface of the imaged plates.

The following examples are provided to illustrate the practice of this invention, and not to limit it in any manner. Unless otherwise noted, all percentages are by weight.

EXAMPLE 1

Six imaging coating formulations were prepared as shown in the following TABLE I and printing plates prepared therefrom:

TABLE I

| COMPONENT | PARTS PER 100 IN WET FORMULATION | | | | | |
|---|---|---|---|---|---|---|
| | Plate 1 | Plate 2 | Plate 3 | Plate 4 | Plate 5 | Plate 6 |
| Cresol-formaldehyde novolac resin | 5.21 | 5.20 | 5.19 | 5.19 | 5.20 | 5.20 |
| CG-21-1005 dye (Ciba Geigy) | 0.11 | 0.11 | 0.11 | 0.11 | 0.11 | 0.11 |
| Carbon black dispersion | 0.35 | 0.35 | 0.35 | 0.35 | 0.35 | 0.35 |
| α-Naphthoflavone dissolution inhibitor | 0.43 | 0.43 | 0.65 | 0.65 | 0.43 | 0.65 |
| 4,6-Dimethyl-N,N'-diphenyl-1,3-benzenesulfonamide developer accelerator | 0 | 0.09 | 0.09 | 0.17 | 0.17 | 0 |
| BYK-307* | 0.01 | 0.01 | 0.01 | 0.01 | 0.01 | 0.01 |

TABLE I-continued

| COMPONENT | PARTS PER 100 IN WET FORMULATION | | | | | |
|---|---|---|---|---|---|---|
| | Plate 1 | Plate 2 | Plate 3 | Plate 4 | Plate 5 | Plate 6 |
| % α-Naphthoflavone to novolac resin | 8.3 | 8.3 | 12.5 | 12.5 | 8.3 | 12.5 |
| % Development accelerator to novolac resin | 0 | 1.7 | 1.7 | 3.3 | 3.3 | 0 |
| Acetone | 7.88 | 7.88 | 7.88 | 7.88 | 7.88 | 7.88 |
| 1-Methoxy-2-propanol | 86.01 | 85.93 | 85.72 | 85.64 | 85.85 | 85.80 |

*BYK-307 is a polyether-modified polydimethylsiloxane available from BYK-Chemie.

Each formulation was applied to give a dry coating weight of about 1.5 g/m$^2$ onto electrochemically grained and sulfuric acid anodized aluminum supports that had been treated with an acrylamide-vinylphosphonic acid copolymer (according to U.S. Pat. No. 5,368,974 of Walls et al), to form imaging layers in unexposed lithographic printing plates.

Each plate was imaged on a commercially available Gerber Crescent 42/T platesetter at 200 rpm and a power setting of 255 (relative) using a laser emitting a modulated pulse centered at 1064 nm to provide an exposure equivalent to 217 mJ/cm$^2$.

The printing plates were then processed for 30 seconds in the alkaline developer composition. After development, the printing plates were rinsed and dried.

Performance of each developing composition was then evaluated by considering $D_{max}$, $D_{min}$, and cleanout time for each developed plate at four levels:

"optimal performance" (all criteria were within the optimal ranges) was rated a "1", "good performance" (all criteria were close to optimal ranges) was rated a "2", "functional performance" (the plates processed did not provide optimal performance but did produce an image with clean non-image areas) was rated a "3", and "poor performance" (the plates did not provide acceptable performance, severe image attack by the developing composition, or lack of processing activity) was rated a "4".

Level One ("1"): $D_{max}$>150, $D_{min}$<35, and cleanout time<16 seconds,

Level Two ("2"): $D_{max}$>145, $D_{min}$<35, and cleanout time<21 seconds,

Level Three ("3"): $D_{max}$>140, $D_{min}$<35, and cleanout time<31 seconds,

Level Four ("4"): $D_{max}$<140, $D_{min}$>35, or cleanout time>31 seconds.

The developing compositions in TABLE II were used to process the printing plates of TABLE I:

TABLE II

| Component (grams) | A | B | C | D |
|---|---|---|---|---|
| Water | 640.0 | 639.0 | 571.0 | 570.0 |
| KASIL 2130 (30%) | 222.0 | 222.0 | 278.0 | 278.0 |
| KOH (90%) | 47.0 | 47.0 | 59.0 | 59.0 |
| Glycerine | 90.0 | 90.0 | 90.0 | 90.0 |

TABLE II-continued

| Component (grams) | A | B | C | D |
|---|---|---|---|---|
| ZONYL ® FSN (40%) | 1.0 | 2.0 | 2.0 | 3.0 |
| SiO$_2$/K$_2$O ratio | 0.79 | 0.79 | 0.79 | 0.79 |
| SiO$_2$ g/1000 g | 45.1 | 45.1 | 56.5 | 56.5 |

The rating results are shown below in TABLE III:

TABLE III

| PLATE | DEVELOPER A | DEVELOPER B | DEVELOPER C | DEVELOPER D |
|---|---|---|---|---|
| 1 | 2 | 4 | 4 | 4 |
| 2 | 3 | 4 | 4 | 4 |
| 3 | 4 | 4 | 1 | 1 |
| 4 | 4 | 4 | 1 | 1 |
| 5 | 1 | 1 | 4 | 4 |
| 6 | 4 | 4 | 2 | 4 |

The results in TABLE III show that:

1) Optimal performance ("1" rating) was achieved when both the developer accelerator and dissolution inhibitor were present in the imaging layer and a nonionic fluorosurfactant (or phosphate ester hydrotrope) was present in the developer composition.
2) Optimal performance was achieved at different levels of developer accelerator and dissolution inhibitor when the concentration of the nonionic fluorosurfactant (or phosphate ester hydrotrope) was adjusted appropriately. That is, a useful range of concentrations for the developer accelerator, dissolution inhibitor and nonionic fluorosurfactant (or phosphate ester hydrotrope) exist to provide optimal performance.
3) The nonionic fluorosurfactant (or phosphate ester hydrotrope) act as dissolution inhibitors. Higher concentrations of either are required when the developer accelerator concentration in the imaging layer is increased or the hydroxyl ion concentration in the developer composition is increased.
4) Low levels of dissolution inhibitor in the coating required lower concentrations of hydroxyl ion and SiO$_2$ in the developer composition to achieve acceptable processing, and therefore, lower levels of nonionic fluorosurfactant (or phosphate ester hydrotrope) in the developer composition. High levels of dissolution inhibitor require high levels of hydroxyl ion and SiO$_2$ in the developer composition and therefore higher levels of nonionic fluorosurfactant (or phosphate ester hydrotrope).

EXAMPLE 2

Another developing composition was similarly prepared but having a phosphate ester hydrotrope, TRITON™ H-66 (50 weight %), in place of the ZONYL® FSN nonionic surfactant.

| Water | 549.0 g |
|---|---|
| KASIL 2130 (30%) | 276.4 |
| KOH (90%) | 58.5 |
| Glycerine | 112.1 |
| TRITON ™ H-66 | 4.0 |
| SiO$_2$/K$_2$O ratio | 0.79 |
| SiO$_2$ g/1000 g | 56.2 |

This developing composition was used to process imagewise exposed printing plates as described in Example 1 above. The result of the processing evaluation was a rating of "2", that is a good performance.

EXAMPLE 3

Developing Composition with Mixture of Compounds

Still another developing composition was similarly prepared but having including both ZONYL® FSN nonionic surfactant (40 weight %) and a phosphate ester hydrotrope TRITON® H-66 (50 weight %).

| Water | 549.0 g |
|---|---|
| KASIL 2130 (30%) | 276.4 |
| KOH (90%) | 58.5 |
| Glycerine | 112.1 |
| ZONYL ® FSN (40%) | 3.0 |
| TRITON® H-66 | 1.0 |
| SiO$_2$/K$_2$O ratio | 0.79 |
| SiO$_2$ g/1000 g | 56.2 |

When this developing composition was used to process an imagewise exposed printing plate as described in Example 1, the results justified a "1"rating, that is, optimal performance.

EXAMPLE 4

Printing plate 7 was prepared like Plate 2 described in Example 1 except that α-naphthoflavone was replaced with 2,6-diphenyl-4H-pyran-4-one (same amount). After imagewise exposure and development with Developer D noted above, the plate evaluation was determined to be a "2", that is good performance.

The invention has been described in detail with particular reference to preferred embodiments thereof, but it will be understood that variations and modifications can be effected within the spirit and scope of the invention.

We claim:

1. A method of processing a positive image, the method comprising:
   developing a printing plate with an alkaline developing composition;
   wherein:
     the printing plate comprises a support having thereon a layer of an imaging composition consisting essentially of a phenolic binder resin, an infrared absorbing compound, a development accelerator, and a non-photosensitive dissolution inhibitor compound capable of providing sites for hydrogen bonding with the phenolic moieties of the binder resin;
     the printing plate has been imagewise exposed with infrared radiation;
     the developing composition has a pH of at least 12 and comprises:
       a) an alkali metal silicate,
       b) at least 6 weight % of a water-soluble or water-dispersible thickener, and c) at least 0.0005 weight % of a nonionic fluorosurfactant, a phosphate ester hydrotrope, or a mixture thereof; and the weight ratio of said development accelerator to said phenolic resin is at least 0.5:100.

2. The method of claim 1 wherein said phenolic resin is a novolac resin.

3. The method of claim 1 wherein said infrared radiation absorbing compound is carbon black, or a squarylium, croconate, cyanine, merocyanine, indolizine, pyrylium or metal dithiolene dye or pigment that has a maximum absorption wavelength at a wavelength of from about 800 to about 1100 nm.

4. The method of claim 1 wherein said non-photosensitive dissolution inhibitor compound has a polar group that is a keto group, said compound having an inhibition factor of at least 0.5.

5. The method of claim 1 wherein said non-photosensitive dissolution inhibitor compound is a xanthone, flavanone, flavone, pyrone, 2,3-diphenyl-1-indenone, or 1'-(2'-acetonaphthonyl)benzoate.

6. The method of claim 1 wherein said non-photosensitive dissolution inhibitor compound is α-naphthoflavone, 2,6-diphenyl-4H-pyran-4-one or 2,6-diphenyl-4H-thiopyran-4-one.

7. The method of claim 1 wherein the weight ratio of said dissolution inhibitor compound to said phenolic resin is at least 1:100.

8. The method of claim 1 wherein said layer of said imaging composition is the sole radiation-sensitive layer in said positive-working printing plate.

9. The method of claim 1 wherein said alkali metal silicate is present in said developing composition in an amount to provide at least 20 g of $SiO_2$ per 1000 g of developing composition, and a weight ratio of $SiO_2$ to $M_2O$ of at least 0.3, wherein M is an alkali metal.

10. The method of claim 9 wherein said alkali metal silicate is present in said developing composition in an amount to provide from about 20 g to about 80 g of $SiO_2$ per 1000 g of developing composition, and a weight ratio of $SiO_2$ to $M_2O$ of from about 0.3 to about 1.2.

11. The method of claim 1 wherein said thickener is present in said developing composition in an amount of from about 6 to about 30 weight %.

12. The method of claim 10 wherein said alkali metal silicate is potassium silicate, said thickener is glycerine, and said glycerine is present in said developing composition in an amount of from about 7.5 to 18 weight %.

13. The method of claim 12 wherein the development accelerator is a low molecular weight polyphenolic compound, a cyclic anhydride, or 4,6-dimethyl-N,N'-diphenyl-1,3-benzenesulfonamide, and the weight ratio of the development accelerator to the phenolic resin is 1:100 to 12.5:100.

14. The method of claim 11 wherein said thickener is glycerine present in said developing composition in an amount of from about 7.5 to about 18 weight %.

15. The method of claim 1 wherein said nonionic fluorosurfactant has the formula $$R_f-CH_2CH_2O-(CH_2CH_2O)_{\overline{z}}H$$

wherein z is 4 to 20 and

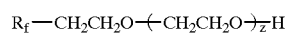

and is present in an amount of up to about 0.4 weight % of said developing composition, and said phosphate ester hydrotrope is an alkali metal salt of an alkyl aryl alkoxy or an aryl alkoxy phosphate ester.

16. The method of claim 1 wherein said alkali metal silicate is potassium silicate, and said thickener is glycerine.

17. A method for providing a positive image consists essentially of the steps of:

A) imagewise exposing a positive-working lithographic printing plate comprising a support having thereon an imaging composition consisting essentially of a phenolic binder resin, an infrared radiation absorbing compound, and a non-photosensitive dissolution inhibitor compound capable of providing sites for hydrogen bonding with the phenolic moieties of the binder resin with an infrared radiation emitting laser, and B) contacting said element with an alkaline developing composition having a pH of from about 12 to about 14 and comprising:

a) a potassium silicate,
b) from about 7.5 to about 18 weight % of glycerine, and
c) from about 0.0005 to about 0.4 weight % of a nonionic fluorosurfactant, a phosphate ester hydrotrope, or a mixture thereof to remove the exposed areas of the positive-working printing plate, said nonionic fluorosurfactant having the formula $$R_f-CH_2CH_2O-(CH_2CH_2O)_{\overline{z}}H$$

wherein z is 4 to 20 and $$R_f \text{ is } F-(CF_2CF_2)_{\overline{3-8}}$$

and said phosphate ester hydrotrope is an alkyl aryl alkoxy or an aryl alkoxy phosphate ester, alkali metal salt.

18. The method of claim 17 wherein said imaging composition further includes a development accelerator, wherein the weight ratio of said development accelerator to said phenolic resin is at least 0.5:100.

19. The method of claim 18 wherein said dissolution inhibitor compound is α-naphthoflavone, and said development accelerator is 4,6-dimethyl-N,N'diphenyl-1,3-benzenedisulfonamide.

20. A method for printing comprising:

A) imagewise exposing a positive-working lithographic printing plate with an infrared radiation emitting laser, the positive-working lithographic printing plate comprising a support having thereon an imaging composition consisting essentially of a phenolic binder resin, an infrared radiation absorbing compound, a development accelerator and a non-photosensitive dissolution inhibitor compound capable of providing sites for hydrogen bonding with the phenolic moieties of the binder resin, thereby forming an exposed printing plate comprising exposed areas;

B) contacting the exposed printing plate with an alkaline developing composition and removing the exposed areas of the exposed printing plate, thereby forming a developed printing plate, the developing composition having a pH of at least 12 and comprising:
a) an alkali metal silicate,
b) at least 6 weight % of a water-soluble or water-dispersible thickener, and
c) at least 0.0005 weight % of a nonionic fluorosurfactant, a phosphate ester hydrotrope, or a mixture thereof; and C) contacting said developed printing plate with an aqueous fountain solution and a lithographic printing ink, thereby forming an inked lithographic printing surface; and D) contacting said inked lithographic printing surface with a substrate to thereby transfer said printing ink to said substrate, thereby forming an image thereon; wherein the weight ratio of said development accelerator to said phenolic resin is at least 0.5:100.

21. The method of claim 20 wherein said nonionic fluorosurfactant has the formula

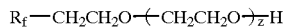

wherein z is 4 to 20 and

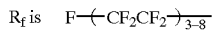

and is present in an amount of up to about 0.4 weight % of said developing composition, and
said phosphate ester hydrotrope is an alkali metal salt of an alkyl aryl alkoxy or an aryl alkoxy phosphate ester.

22. The method of claim 21 wherein said alkali metal silicate is potassium silicate, said thickener is glycerine, and said glycerine is present in said developing composition in an amount of from about 7.5 to 18 weight %.

23. A method of processing a positive image, the method comprising:
developing a printing plate with an alkaline developing composition;
wherein:
the printing plate comprises a support having thereon a layer of an imaging composition consisting essentially of a phenolic binder resin, an infrared absorbing compound, and a non-photosensitive dissolution inhibitor compound capable of providing sites for hydrogen bonding with the phenolic moieties of the binder resin;
the printing plate has been imagewise exposed with infrared radiation;
the developing composition has a pH of at least 12 and comprises:
a) an alkali metal silicate,
b) at least 6 weight % of a water-soluble or water-dispersible thickener, and
c) at least 0.0005 weight % of a nonionic fluorosurfactant, a phosphate ester hydrotrope, or a mixture thereof; and said nonionic fluorosurfactant has the formula

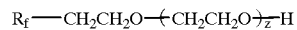

wherein z is 4 to 20 and

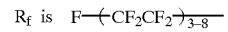

and is present in an amount of up to about 0.4 weight % of said developing composition, and
said phosphate ester hydrotrope is an alkali metal salt of an alkyl aryl alkoxy or an aryl alkoxy phosphate ester.

24. The method of claim 23 wherein said phenolic resin is a novolac resin.

25. The method of claim 23 wherein said non-photosensitive dissolution inhibitor has a keto group, said non-photosensitive dissolution inhibitor has an inhibition factor of at least 0.5, and the ratio of said non-photosensitive dissolution inhibitor to said phenolic compound is at least 1:100.

26. The method of claim 23 wherein said non-photosensitive dissolution inhibitor compound is a xanthone, flavanone, flavone, pyrone, 2,3-diphenyl-1-indanone, or 1'-(2'-acetonaphthonyl)benzoate.

27. The method of claim 26 wherein said non-photosensitive dissolution inhibitor compound is α-naphthoflavone, 2,6-diphenyl-4H-pyran-4-one or 2,6-diphenyl-4H-thiopyran-4-one, and wherein the weight ratio of said dissolution inhibitor compound to said phenolic resin is at least 1:100.

28. The method of claim 27 wherein the imaging composition further includes a development accelerator and the weight ratio of the development accelerator to the phenolic resin is 1:100 to 12.5:100.

29. The method of claim 23 wherein said layer of said imaging composition is the sole radiation-sensitive layer in said positive-working printing plate.

30. The method of claim 23 wherein said alkali metal silicate is present in said developing composition in an amount to provide at least 20 g of $SiO_2$ per 1000 g of developing composition, and a weight ratio of $SiO_2$ to $M_2O$ of at least 0.3, wherein M is an alkali metal.

31. The method of claim 30 wherein said alkali metal silicate is present in said developing composition in an amount to provide from about 20 g to about 80 g of $SiO_2$ per 1000 g of developing composition, and a weight ratio of $SiO_2$ to $M_2O$ of from about 0.3 to about 1.2.

32. The method of claim 23 wherein said thickener is present in said developing composition in an amount of from about 6 to about 30 weight %.

33. The method of claim 32 wherein said alkali metal silicate is potassium silicate, said thickener is glycerine, and said glycerine is present in said developing composition in an amount of from about 7.5 to 18 weight %.

34. The method of claim 23 wherein the imaging composition further includes a development accelerator and the weight ratio of the development accelerator to the phenolic resin is 1:100 to 12.5:100.

35. The method of claim 34 wherein the development accelerator is a low molecular weight polyphenolic compound, a cyclic anhydride, or 4,6-dimethyl-N,N'-diphenyl-1,3-benzenesulfonamide.

* * * * *

UNITED STATES PATENT AND TRADEMARK OFFICE
CERTIFICATE OF CORRECTION

PATENT NO. : 6,083,662
DATED : July 4, 2000
INVENTOR(S) : Miller et al.

It is certified that error appears in the above-identified patent and that said Letters Patent are hereby corrected as shown below:

[73] Assignee: Kodak Polychrome Graphics, LLC, Norwalk, Conn.

Signed and Sealed this

Tenth Day of April, 2001

Attest:

NICHOLAS P. GODICI

*Attesting Officer*     *Acting Director of the United States Patent and Trademark Office*